US008663902B2

(12) United States Patent
Jarvis et al.

(10) Patent No.: US 8,663,902 B2
(45) Date of Patent: Mar. 4, 2014

(54) LASER IMAGING

(75) Inventors: Anthony Jarvis, Widnes (GB); Martin Walker, Widnes (GB); Christopher Wyres, Widnes (GB); Tristan Phillips, Widnes (GB)

(73) Assignee: Datalase Ltd, Cheshire (GB)

( * ) Notice: Subject to any disclaimer, the term of this patent is extended or adjusted under 35 U.S.C. 154(b) by 0 days.

(21) Appl. No.: 13/260,651

(22) PCT Filed: Apr. 1, 2010

(86) PCT No.: PCT/GB2010/050582
§ 371 (c)(1),
(2), (4) Date: Sep. 27, 2011

(87) PCT Pub. No.: WO2010/112940
PCT Pub. Date: Oct. 7, 2010

(65) Prior Publication Data
US 2012/0021362 A1 Jan. 26, 2012

(30) Foreign Application Priority Data

Apr. 2, 2009 (GB) .................................. 0905785.2
Aug. 26, 2009 (GB) .................................. 0914912.1

(51) Int. Cl.
*G11B 7/24* (2013.01)
(52) U.S. Cl.
USPC .................................. 430/270.16; 430/336
(58) Field of Classification Search
None
See application file for complete search history.

(56) References Cited

U.S. PATENT DOCUMENTS

| 3,501,303 | A | * | 3/1970 | Foltz et al. .................... 430/332 |
| 4,208,186 | A | | 6/1980 | Patel |
| 4,215,208 | A | | 7/1980 | Yee et al. |
| 4,228,126 | A | * | 10/1980 | Patel et al. .................... 422/400 |
| 4,705,742 | A | * | 11/1987 | Lewis ........................... 430/333 |
| 4,782,006 | A | * | 11/1988 | Nishimura et al. ........... 430/292 |
| 5,004,671 | A | * | 4/1991 | Nishimura et al. ....... 430/270.15 |
| 5,049,428 | A | * | 9/1991 | Kanno et al. ................. 428/64.7 |
| 5,137,964 | A | * | 8/1992 | Lewis et al. .................... 524/550 |
| 5,149,617 | A | | 9/1992 | Liu |
| 5,731,112 | A | * | 3/1998 | Lewis et al. ...................... 430/15 |
| 2008/0305328 | A1 | * | 12/2008 | Green et al. ................... 428/354 |
| 2009/0191480 | A1 | * | 7/2009 | Rogers et al. ............... 430/283.1 |
| 2011/0017961 | A1 | * | 1/2011 | Jarvis ............................. 252/586 |
| 2011/0109014 | A1 | * | 5/2011 | Rogers et al. ................. 264/319 |
| 2011/0122347 | A1 | * | 5/2011 | Jarvis et al. ................... 349/106 |
| 2011/0136934 | A1 | * | 6/2011 | Jarvis et al. ................... 522/158 |
| 2011/0148092 | A1 | * | 6/2011 | Jarvis et al. ..................... 283/67 |
| 2011/0151380 | A1 | * | 6/2011 | Jarvis et al. ............. 430/270.11 |
| 2011/0151384 | A1 | * | 6/2011 | Walker et al. ................. 430/338 |
| 2011/0155815 | A1 | * | 6/2011 | Jarvis et al. ................... 235/494 |
| 2011/0159268 | A1 | * | 6/2011 | Jarvis ............................. 428/221 |
| 2011/0167572 | A1 | * | 7/2011 | Jarvis ................................ 8/444 |
| 2012/0021363 | A1 | * | 1/2012 | Jarvis ........................... 430/374 |

FOREIGN PATENT DOCUMENTS

| JP | 62-174749 | * | 7/1987 |
| JP | 63-050832 | * | 3/1988 |
| JP | 63-052134 | * | 3/1988 |
| JP | 63-052135 | * | 3/1988 |
| JP | 02-202923 | | 8/1990 |
| JP | 2000-248257 | * | 9/2000 |
| WO | 92/07297 | * | 4/1992 |
| WO | WO 2006/018640 | | 2/2006 |
| WO | WO 2007/045912 | | 4/2007 |
| WO | WO 2008/050153 | | 5/2008 |
| WO | WO 2010/026408 | | 3/2010 |

* cited by examiner

*Primary Examiner* — Martin Angebranndt
(74) *Attorney, Agent, or Firm* — Saliwanchik, Lloyd & Eisenschenk

(57) ABSTRACT

A method of forming an image on a substrate, which comprises applying to the substrate an activatable color forming compound wherein said activatable color forming compound is initially unreactive but becomes reactive upon activation; activating said color forming compound in the areas of the substrate where the image is to be formed, and, reacting the activated color forming compound into its colored form to produce an image. A substrate imaged using this method is also provided.

25 Claims, No Drawings

LASER IMAGING

CROSS REFERENCE TO A RELATED APPLICATION

This application is a National Stage Application of International Application Number PCT/GB2010/050582, filed Apr. 1, 2010; which claims priority to Great Britain Application No. 0905785.2, filed Apr. 2, 2009 and Great Britain Application No. 0914912.1, filed Aug. 26, 2009; all of which are incorporated herein by reference in their entirety.

FIELD OF THE INVENTION

The present invention relates to a method of forming images on a substrate comprising applying to the substrate an activatable colour-forming compound and substrates imaged thereby.

BACKGROUND TO THE INVENTION

Certain diacetylenes are known to be capable of forming colour on exposure to light. 10,12-Pentacosadiynoic acid is well known in the art to be an example of such a diacetylene. This compound is initially colourless in its unreacted state, but on exposure to UV light undergoes a topochemical polymerization reaction to generate a blue coloured polydiacetylene, which can then be transformed into a red coloured form by thermal perturbations.

WO06/018640 teaches the application of diacetylenes, such as 10,12-pentacosadiynoic acid, in multi-colour printing applications in combination with a photoacid or photobase generating species. Colour forming diacetylenes, such as 10,12-pentacosadiynoic acid and the like, are typically very reactive, and can undergo the initial polymerization reaction on exposure to fluence values as low as 50 mJcm$^{-2}$. The consequence of this high reactivity is poor stability to background radiation. Light sensitive diacetylenes will gradually polymerise and turn blue on storage. In order to generate colourless coatings with these compounds it is usually necessary to purify them, via re-crystallisation, prior to use, which is time consuming and wasteful. Also, any coatings made using these diacetylenes will gradually turn blue on exposure to background radiation. This severely limits the range of applications that the coating can be used in.

SUMMARY OF THE INVENTION

In a first aspect, the present invention provides a method of forming an image on a substrate, which comprises applying to the substrate an activatable colour forming compound wherein said activatable colour forming compound is initially unreactive but becomes reactive upon activation; activating said colour forming compound in the areas of the substrate where the image is to be formed, and, reacting the activated colour forming compound into its coloured form to produce an image.

In a second aspect, the present invention provides a substrate imaged using the method of the first aspect of the invention.

In a third aspect, the present invention provides the use of the substrate according to the second aspect of the invention, to display human and/or machine readable information.

DETAILED DESCRIPTION OF THE INVENTION

We have observed certain diacetylene compounds that in their initial solid form are unreactive to UV light, and in this initial form are essentially incapable of undergoing light induced colour change reactions. However, when said diacetylene compounds are activated in some manner, for instance by melting and re-solidifying, they transform into a solid form that is highly reactive to UV light and will subsequently undergo light induced colour change reactions: colourless to blue to magenta, to red to orange to yellow, and green.

Surprisingly, we have used these 'activatable' diacetylene compounds to create coatings that are essentially stable to background radiation. The coatings can be prepared by applying the 'activatable' diacetylene in combination with a near infrared (NIR) absorbing agent. A NIR light source, such as a NIR fibre laser, can then be used to heat the coating only in the areas where the image is required. A UV light source, such as a germicidal lamp, is then used to flood the coating with UV light. However, the diacetylene compound only undergoes a colour change reaction to create an image in the areas which were initially exposed to NIR light. The areas of the coating unexposed to NIR light undergo a negligible colour change reaction, remain essentially colourless, and are stable to background radiation. A UV laser can also be used to image the coating in only those areas previously activated by the NIR light source.

Colour Forming Compounds

The present invention includes any colour forming compound that is 'activatable', i.e. has a first solid form that is relatively unreactive to light, but upon 'activation' is transformed into a second form that is relatively reactive to light and is thus capable of undergoing a colour change reaction to create a visible image. Without being limited by theory the activation could be a re-crystallisation, crystal form modification, co-crystal combination or melting/re-solidification process. Preferred activatable compounds are poly-ynes such as diacetylenes, triacetylenes, tetraacetylenes and the like. A poly-yne is a compound comprising two or more adjacent carbon-carbon triple bond groups.

where n is an integer ≥ 1.

Diacetylenes, where n=1 are particularly preferred. Diacetylenes are compounds that comprise the following group:

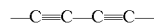

Particularly preferred diacetylenes are those that after initial activation (e.g. by melting and re-solidification) are colourless but become blue on exposure to light, particularly UV light. Particularly preferred diacetylene compounds are carboxylic acids and derivatives thereof represented by the general structure:

where:
x=0 to 20
Q=NH, S, O
Z=H or a straight or branched hydrocarbon alkyl chain of C=0 to 20, or any group comprising at least one carbon atom; wherein Z optionally comprises at least one —CO-Q- and/or a —O— or —S—, —NR— group (R is H or alkyl); and Y=H, —(CH$_2$)$_n$—CO-Q-Z (as above), a straight or branched hydrocarbon alkyl chain of C=0 to 20, or any group comprising at least one carbon atom.

Examples of diacetylene carboxylic acid compounds that form part of the present invention include but are not limited to: 10,12-docosadiyndioic acid, 9,11-eicosadiyndioic acid, 8,10-octadecadiyndioic acid, 7,9-hexadecadiyndioic acid, 6,8-tetradecadiyndioic acid, 5,7-docosadiyndioic acid, 4,6-decadiyndioic acid, 3,5-octadiyndioic acid, 2,4-hexadiyndioic acid, 10,12-pentacosadiynoic acid, 5,7-docosadiyndioic acid, 5,7-dodecadiynoic acid, 4,6-dodecadiynoic acid, 5,7-eicosadiynoic acid, 5,7-eicosadiyn-1-ol, 6,8-heneicosadiynoic acid, 8,10-heneicosadiynoic acid, 12,14-heptacosadiynoic acid, 2,4-heptadecadiynoic acid, 4,6-heptadecadiynoic acid, 5,7-hexadecadiynoic acid, 10,12-heneicosaadiynoic acid, 10,12-nonacosadiynoic acid, 10,12-heptacosadiynoic acid, 10,12-octadecadiynoic acid, 10,12-pentacosadiynoic acid, 10,12-tricosadiynoic acid, 6,8-nonadecadiynoic acid, 5,7-octadecadiynoic acid, 10,12-octadecadiynoic acid, 5,7-tetradecadiynoic acid, 14-hydroxy-10,12-tetradecadiynoic acid. 10,12-Pentacosadiynoic acid and 10,12-docosadiyndioic acid and derivatives thereof are particularly preferred. Where the diacetylene compound is a dicarboxylic acid and derivatives thereof, it can be either symmetrical or unsymmetrical.

Particularly preferred still are derivatives in which the carboxylic acid group has been functionalised into an amide, ester or thioester. These can be easily made by reacting a diacetylene carboxylic acid with a chlorinating agent such as oxalyl chloride and then reacting the diacetylene acid chloride with a nucleophilic compound such as an amine, alcohol or thiol. Amides (—CONR—) are particularly preferred still, where R=H or alkyl group.

A particularly preferred series of amides are those derived from primary amines (—CONH—). A primary amine is a compound with the following general structure:

R—NH$_2$ where R=H or any group known in organic chemistry comprising at least one carbon atom.

A particularly preferred series of primary amines are those where R is a saturated alkyl chain. These can be easily made by reacting a diacetylene carboxylic acid with a chlorinating agent such as oxalyl chloride and then reacting the diacetylene acid chloride with a saturated primary aliphatic amine in the presence of a base. A particularly preferred type of saturated alkyl chains are saturated, aliphatic hydrocarbon chains, represented by the following formula:

$C_nH_{2n+1}$ where n is an integer≤20.

The saturated, aliphatic hydrocarbon chains can be either straight chained or branched. Straight chains are particularly preferred. Examples of saturated, aliphatic hydrocarbon chain primary amines comprising 0 to 20 carbon atoms include: ammonia, methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, and octadecylamine, nonadecylamine and eicosamine. Other longer chain fatty primary amines that give rise to heat activation also form part of the present invention although n in the range 0 to 20 is particularly preferred.

Where the diacetylene carboxylic acid compound comprises more than one carboxylic acid group any number of them can be derivatised into an alkylamide. E.g. 10,12-docosadiyndioic comprises two carboxylic acid groups, one or two of them can be derivatised to give rise to the mono or bis-alkylamide compounds. For 10,12-docosadiyndioic-bis-alkylamide compounds made from saturated, straight chain hydrocarbon, aliphatic amines it has been surprisingly found that for heat activation to occur n in the above alkyl chain formula has to fall in the range 6 to 20. When n 5 heat activation does not occur, these alkylamide compounds are light reactive as formed and therefore do not form part of the present invention. Particularly preferred 10,12-docosadiyndioic-bis-alkylamides are those made from straight alkyl chains comprising an even number of carbon atoms i.e. n=6, 8, 10, 12, 14, 16, 18 and 20.

Other amines that can be used to create diacetylene carboxylic acid amides that form part of the present invention include: alcohol amines such as ethanolamine, propanolamine, butanolamine, pentanolamine, hexanolamine, heptanolamine, octanolamine, nonanolamine, decanolamine, undecanolamine and dodecanolamine and the like, the alcohol amine compound can comprise more than one OH group, such as 3-amino-1,2-propanediol and bis-homotris, Also included are ethoxylated amines such as amino-PEGs and 2,2'-(ethylenedioxy)bis(ethylamine) and the like. Another series of particularly preferred primary amines are amino carboxylic acids. These are compounds that comprise both an amino group and a carboxylic acid group. Examples include alpha-amino acids found in nature such as glycine, alanine and the like, but also 4-aminobutanoic acid, 5-aminopentanoic acid, 6-aminohexanoic acid, 7-aminoheptanoic acid, 8-aminooctanoic acid, 9-aminononanoic acid, 10-aminodecanoic acid, 11-aminoundecanoic acid and 12-aminododecanoic acid and the like. Reacting these amino carboxylic acids with for example a diacetylene that comprises two carboxylic acid groups gives rise to a diacetylene-bis-amide carboxylic acid compound that can be represented by the following general formula:

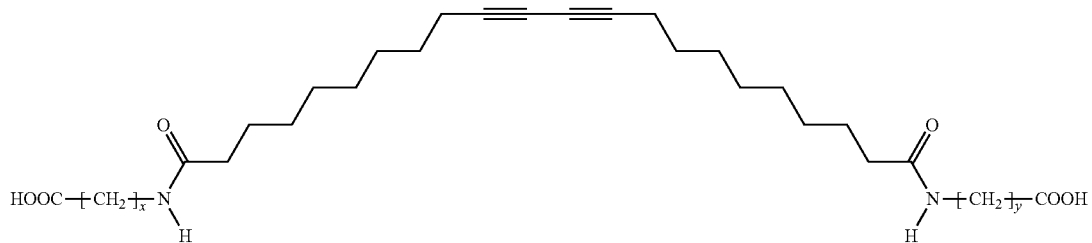

where x=0 to 20 and y=0 to 20.

The amino carboxylic acid compounds are capable of reacting with a diacetylene acid chloride to give rise to a diacetylene amide compound that also comprises a carboxylic acid group that can then be further derivatised, e.g. reacted with a primary amine to give a diacetylene compound with multiple amide groups.

Another, particularly preferred 10,12-docosadiyndioic acid amide derivative is the propargylamide in which at least one, preferably both carboxylic acid groups have been transformed into the propargylamide:

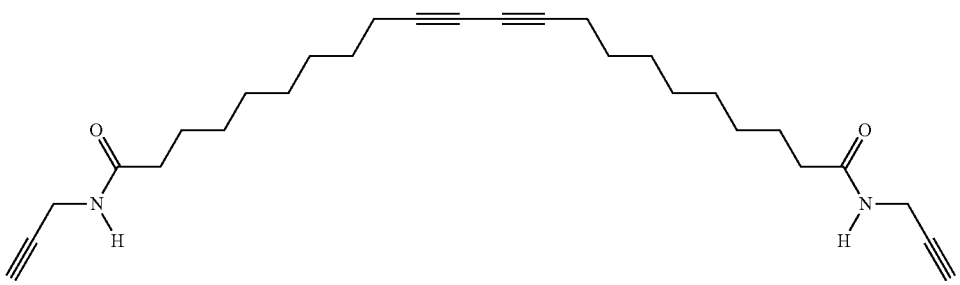 [SMILES: C#CCNC(=O)CCCCCCCCC#CC#CCCCCCCCCC(=O)NCC#C]

10,12-Docosadiyn-bis-propargylamide

Propargylamides are made by reacting carboxylic acids with propargylamine. Other preferred amines that can be used to create suitable amides include: dipropargylamine and 1,1-dimethylpropargylamine.

Further examples of diacetylene compounds include diacetylene alcohols and diols such as: 2,4-hexadiyne-1,6-diol, 3,5-octadiyn-1,8-diol, 4,6-decadiyn-1,10-diol, 5,7-dodecadiyn-1,12-diol, 1,6-bis-(4-methoxy-phenyl)-1,6-diphenyl-hexa-2,4-diyne-1,6-diol, 2,7-dimethyl-3,5-octadiyn-2,7-diol, 1,1,1,8,8,8-hexaphenyl-octa-3,5-diyne-2,7-diol, 1,1,6,6-tetrakis-(3-methoxy-phenyl)-hexa-2,4-diyne-1,6-diol, 1,1,6,6-tetrakis-biphenyl-4-yl-hexa-2,4-diyne-1,6-diol, 1,1,6,6-tetraphenyl-hexa-2,4-diyne-1,6-diol, 2,4-heptadecadiyn-1-ol, 10,12-pentacosadiyn-ol and derivatives thereof. Where the compound is a diol, it can be either symmetrical or unsymmetrical. A preferred derivative of 2,4-hexadiyne-1,6-diol is 2,4-hexadiyne-1,6-diyl-bis(4-n-hexoxybenzoate).

Particularly preferred diacetylene alcohol and diol derivatives are mono and bis-urethanes. Urethanes have the general structure:

Urethanes are made by reacting the diacetylene alcohol or diol compound with an isocyanate compound (R'—NCO). Particularly preferred urethanes are those based on 2,4-hexadiyn-1,6-diol. Further examples of urethane compounds that form part of the present invention are taught in U.S. Pat. No. 4,228,126 and U.S. Pat. No. 4,276,190.

Further diacetylene derivatives include ethers (—O—) and thioethers (—S—).

Other compounds that form part of the present invention include the ring diacetylene compounds taught by Zhou et al in *J. Org. Chem.* 1994, 59, 1294-1301 that can be represented by the general formula:

where R is H or an alkyl or alkoxy chain of C=1 to 12, and n=1 to 12 and mixtures thereof.

Particularly preferred compounds are those capable of generating more than one colour after activation. Further examples of suitable diacetylenes are disclosed in WO2006/018640 and WO2010/001171.

Activation may occur by the application of stimuli such as: heat which can be coherent or non-coherent, broadband or monochromatic NIR reaction or direct contact heat, melting, re-crystallisation, light, solvents, chemicals, biological entities, pressure and/or electrical discharge. Activation of the colour forming compound may occur via a process known as 'polymorphism'. Polymorphism is defined as the ability of a solid material to exist in more than one form or crystal structure. Compounds containing —NH— and —CO— groups, particularly amide groups and urethane groups (—NHCO— and —OCONH—) as this affords intra and inter molecular hydrogen bonding may undergo polymorphism. Reversible polymorphism between unactivated and activated forms is preferred. 10,12-DDA-PADA is a compound suitable for use in this invention which can undergo polymorphism. It is initially synthesized either in an amorphous form, or more likely, in a crystal form in which the diacetylene tilt angle and stacking distance are not optimal for colour formation topochemical polymerisation (i.e. 45°, 450 pm). However, upon heating the compound it either: i. reaches a temperature where it undergoes a crystal form change, and/or ii. eventually melts and re-freezes into a different crystal form, in which the tilt angle and stacking distance are such that a very reactive colour forming process can take place.

Preferably, the colour forming compound is reversibly activatable. This is the concept of being able to switch off the compound once it has been activated. The following schematic shows this process with a diacetylene compound:

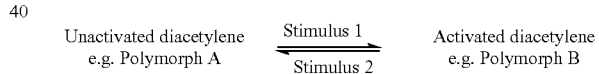

Such a system enables one to activate the diacetylene for colour formation and then switch off any activated areas which should not be coloured. This would be particularly advantageous for melt processed plastic colouration in which the diacetylene compound is activated during melt processing but could then be switched off to develop sufficient light fastness in the background areas where colouration is not required, for e.g. FMCG plastic parts such as bottles and closures. In the above schematic stimulus 2 could just be switching stimulus 1 off.

An example of this is the use of photoisomerism such as the cis-trans photoisomerism exhibited by azobenzene.

Other methods of activation include the following:

Ring-Opening Reactions

By way of an example, a diacetylene moiety may be attached to a closed ring system. In the closed form the diacetylene is unactivated. However, opening the ring system causes the diacetylene to stack into the correct tilt angle and distance for topochemical polymerisation to take place. Other specific examples include:

Lactams—caprolactam thermal polymerisation to nylon 6
Lactones—caprolactone
ROMP of enes Cyclic ethers—cationic and anionic
Anionic cycloalkanes e.g. cyclopropane, cyclophanes
Radical ring-opening polymerisation—e.g. vinyl cyclopropanes
Hydrolysis of cyclics
Ring opening of fluorans
An example of a caprolactam diacetylene ring opening is shown below:

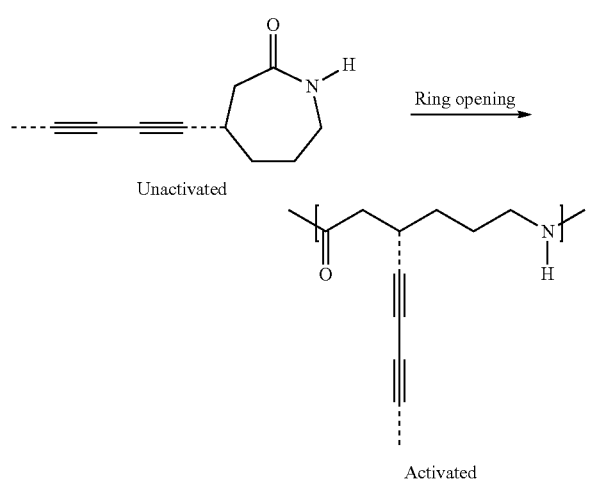

It is also possible for the ring opening reaction to be reversible, i.e. a ring closing reaction to deactivate the diacetylene to topochemical polymerisation reactions.

Charge Generation/Removal

The colour forming compound may comprise an ionisable group, such as an ammonium group for positive charge, or a carboxylic (—COOH) or sulphonic acid (—$SO_3H$) group for negative charge. Creating or removing the charge, typically by protonation or deprotonation, causes the colour forming compound (for instance, a diacetylene) to transform from unactivated to activated states. For instance, removing charge may remove electrostatic repulsion barriers and enable diacetylene molecules to line up into the correct tilt angle/stacking distance for topochemical polymerisation to occur.

Reversible charge generation wherein a diacetylene can flip between unactivated and activated forms upon charge generation/removal is preferred.

Where charge generation occurs as a result of protonation, the system may also comprise a photoacid generator. Where charge generation occurs as a result of deprotonation, the system may also contain a photo base generator.

Leaving Group Cleavage

The colour forming compound may comprise at least one group whose presence causes the molecule to be 'unactivated'. However, the group can be readily removed, via a bond breakage or cleavage reaction, from the main colour forming molecule and its removal causes the remaining colour forming fragment to become activated. This is demonstrated in the following schematic:

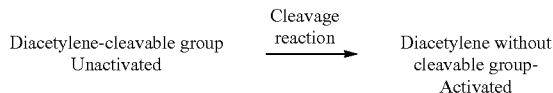

Examples of leaving group cleavage include: hydrolysis, decarboxylation, deesterification, dehydrohalogenation, detosylation, photocleavage, photolysis, thermolysis, acidic and basic cleavage. The cleavage reaction and consequent diacetylene activation is preferably reversible.

Photochromic Molecules

Molecules such as spirooxazines and naphthopyrans are known to exhibit a reversible photochromic effect. In the absence of UV light they are colourless but upon exposure to UV light they become coloured. However, upon removal of the UV source these molecules turn back to being colourless usually over the space of a few minutes. The mechanism by which these compounds generate colour upon exposure to UV light is a twisting rings mechanism. When uncoloured the molecule exists in a perpendicular or 'closed' structure, but upon UV exposure it is converted into a flat, planar 'opened' structure. This allows the two halves to interact, resulting in the absorption of visible light.

A colour forming compound such as a diacetylene moiety may be attached to such a system. In the absence of a stimulus (UV light) there is a perpendicular or closed structure in which the diacetylene moieties cannot undergo topochemical polymerization reactions, i.e. is unactivated. However, upon exposure to a stimulus the structure becomes open or flat/planar in which the diacetylene moieties have the right tilt angle/stacking distance for topochemical polymerization and thus they become activated.

Chirality

Here the colour forming compound, for instance a diacetylene molecule possesses a chiral centre, and thus can exist as two optical isomers or enantiomers. One enantiomer is 'unactivated' and the other is 'activated' to topochemical polymerisation. However, an external stimulus can cause it to flip between the two, preferably reversibly.

Fluoro Compounds

Here a fluorocarbon chain is part of the colour forming compound, for instance a diacetylene molecule, for crystal phase generation.

The Presence of Activating/Deactivating Agents

A species may be present with the colour forming compound, preferably a diacetylene compound whose physical presence causes the diacetylene to be unactivated to topochemical polymerization reactions. An external stimulus removes the species and thus the colour forming compound is activated. However, once activated adding the returning species causes it to be deactivated. Examples include impurities and plasticisers.

Water of Hydration

The colour forming compound (preferably a diacetylene compound) has associated with it water of crystallization whose presence either unactivates or activates the compound to topochemical polymerization reactions. However, removing this water of crystallization causes it to be activated or unactivated, and this is a reversible process.

Co-Crystals

The colour forming compound, for instance, a diacetylene may form a co-crystal. In the co-crystal form the compound can be either activated or unactivated. A stimulus can cause the co-crystal to breakdown or form. This process is reversible.

Diacetylene Liquid Crystals

We have found that colour forming diacetylene compounds can be made that exhibit liquid crystalline phases. Particularly preferred are those compounds that have a phase that is relatively unreactive but it can be made to flip into a phase that is relatively reactive. Examples include:

Other examples include:

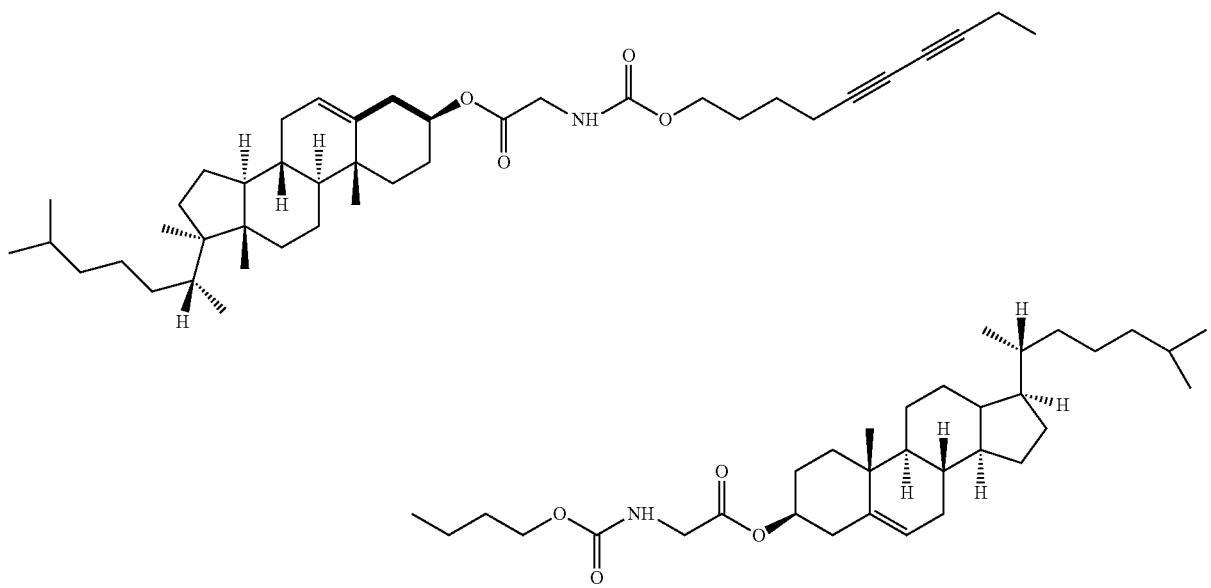

Where R=alkyl, X=alkyl, alkoxy, cyano, chloro, fluoro, trifluoromethyl etc.

Naphthylmethylammonium salts of diacetylene carboxylic acids e.g.

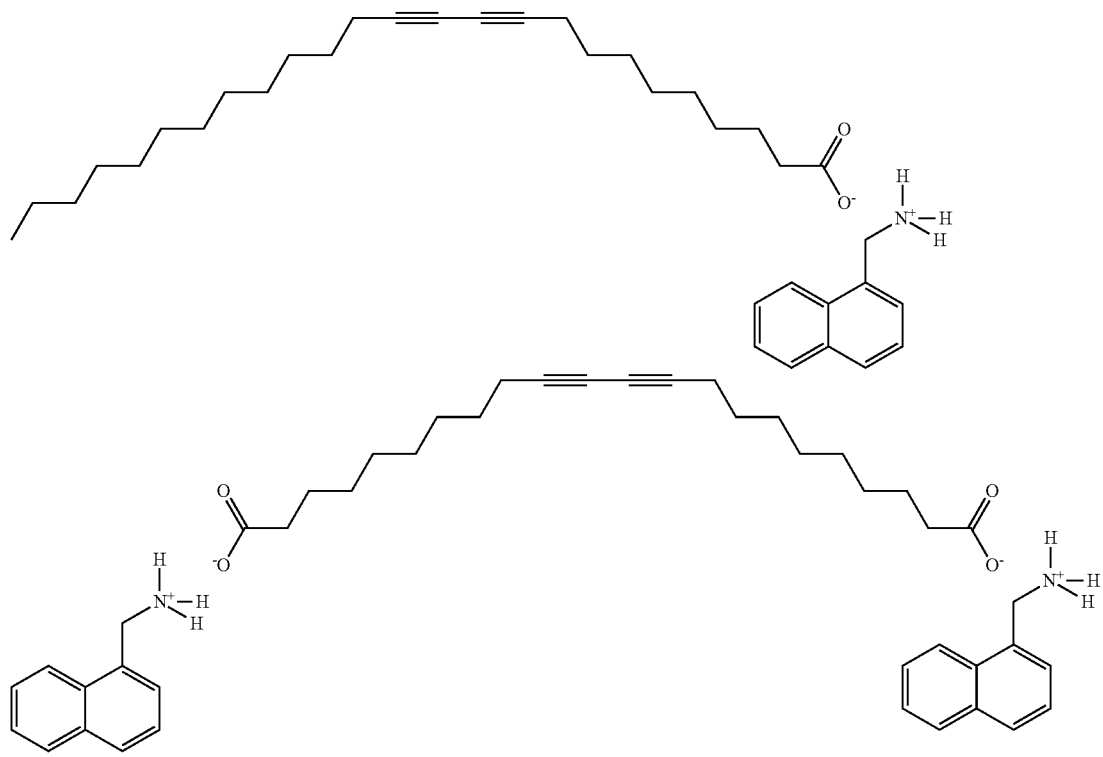

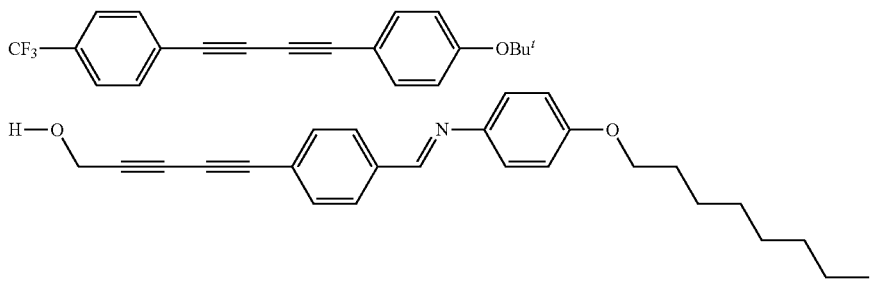

Metal Complex Diacetylenes

For instance, a diacetylene bonded to a metal centre.

Surface Active Diacetylenes

These are diacetylenes that line up on a surface in a self-assembled monolayer, e.g. on to pigment, polymer or NIR absorber particles. For instance, 10,12-Pentacosadiynoic acid metal salt, e.g. sodium salt, deposited on to a surface as a monolayer with the hydrophilic-hydrophobic portions aligned like a surfactant. When in alignment the form is relatively reactively compare to before alignment.

Diacetylenes in Polymer Side Chains

For instance, the polymer main chain is e.g. a liquid crystal. A typical example is 10,12-Pentacosadiynoic acid, via its acid chloride grafted on to poly(allylamine).

Electro-Diacetylenes

The application/removal of an electrical field to orientate/deorientate diacetylenes for activation/deactivation. The in situ generation of space-charge fields for diacetylene activation.

Other Effects

Without being constrained by theory, the colour forming mechanism of a diacetylene is a topochemical polymerization to yield a polydiacetylene comprising a network of conjugated alternate double and triple bonds:

It is also known that polydiacetylenes have electrical conductivity properties. The present invention can also be used to create light printable electronics. It is especially preferred that the activatable diacetylenes are applied to onto thin flexible substrates. Such a substrate could be used in the manufacture of circuit boards, electronic displays, photovoltaics, printed sensors, smart packaging and textiles.

Diacetylenes polymerise to give polydiacetylenes that comprise a network of conjugated double and triple bonds. It is this conjugation that gives rise to absorption in the visible region of the spectrum and consequently colour. The network of conjugated double and triple bonds also gives rise to electrical conductivity thereby making polydiacetylenes conductive polymers. The diacetylenes of the present invention are particularly suitable for creating conductive polydiacetylenes in printed electronics applications. The ability of the activatable diacetylenes not to undergo any polymerisation unless activated allows for the production of stable printed electronic devices that can be exposed to the environment without changes in conductivity due to unwanted polymerisation reactions taking place on exposure to background radiation.

The conductivity of polydiacetylenes can be increased by doping. Doping with iodine for example is well known in the art for increasing the conductivity of polydiacetylenes. However, it would be particularly advantageous to employ a photodoping agent that is activated at the sample time as the activated diacetylene undergoes polymerisation to yield a polydiacetylene. Examples of such photodoping agents are 'onium' type photoacid generators, a suitable example of which is Cyracure UVI-6974.

The activatable diacetylenes and polydiacetylenes thereof of the present invention are particularly suited for use in printed electronics in the following areas: ultra thin displays, solar panels, electronic skin patches, smart packaging. They are also particularly suitable for application onto thin flexible substrates like plastic and paper. They can be used to make organic thin film transistors such as those used in electronic displays such as e-paper, LCD and OLED. They are also suitable for use in low cost organic sensors, photovoltaics and Integrated Circuits.

NIR Light Absorbing Agent

NIR light absorbing agents are compounds that absorb light in the wavelength range 700 to 2500 nm. They may be used together with a colour forming compound which is heat-activatable. Specific examples of the type of compound that form may be used in the present invention include but are not limited to:
  i. Organic NIR absorbing agents
  ii. NIR absorbing 'conductive' polymers
  iii. Inorganic NIR absorbing agents
  iv. Non-stoichiometric inorganic NIR absorbing agents.

Particularly preferred NIR absorbing agents are those that have essentially no absorbance in the visible region of the spectrum (400 to 700 nm) and thus give rise to coatings that appear visibly colourless.

Organic NIR absorbing agents are known as NIR dyes/pigments. Examples include but are not limited to: families of metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines.

Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by HW Sands, Jupiter, Fla., USA; the Lumogen™ series supplied by BASF, Germany, particularly Lumogen™ IR765, IR788 and IR1050; and the Pro-Jet™ series of dyes supplied by FujiFilm Imaging Colorants, Blackley, Manchester, UK, particularly Pro-Jet™ 830NP, 900NP, 825LDI and 830LDI. Further examples are sold by HW Sands and Few Chemicals GmbH. Further examples are taught in WO08/050,153.

Examples of NIR absorbing 'conductive' polymers include PEDOT such as, the Clevios range of products supplied by HC Starck. Further examples are taught in WO05/12442.

Examples of inorganic NIR absorbing agents include copper (II) salts. Copper (II) hydroxyl phosphate (CHP) is particularly preferred. Further examples are taught in WO05/068207.

Examples of non-stoichiometric inorganic absorbing agents include reduced indium tin oxide, reduced antimony tin oxide and reduced titanium nitrate, reduced zinc oxide. Further examples are taught in WO05/095516. Reduced indium tin oxide is particularly preferred in combination with a 1550 nm to 2500 nm laser. Doped inorganic NIR absorbers also form part of the present invention.

It is particularly preferred if the absorption profile of the NIR absorbing agent approximately matches the emission wavelength(s) of the NIR light source employed.

NIR absorbing agents are preferred however, the invention is not limited to these. Other light absorbing agents that can be used include UV (200 to 400 nm), visible (400 to 700 nm) and mid-infrared (~10.6 microns) light absorbing agents. Examples includes dyes/pigments, UV absorbers and Iriodin type agents.

Coatings

The colour forming compound and NIR absorbing agent (if present) are typically applied to a substrate via an ink formulation. The ink formulation can be aqueous or non-aqueous based. This can be an ink formulation that comprises both the colour forming compound and NIR absorbing agents. Or they can be applied separately with a first coating layer comprising one of the two species beneath an upper layer comprising the other. The ink formulation(s) can also comprise other additive(s) known in the art of printing such as: binders which are typically polymers and includes acrylic polymers, styrene polymers and hydrogenated products thereof, vinyl polymers and derivatives thereof, polyolefins and hydrogenated and epoxidised products thereof, aldehyde polymers, epoxide polymers, polyamides, polyesters, polyurethanes, sulphone-based polymers and natural polymers and derivatives thereof such as cellulose based binders. The binder can also be a mixture of polymeric binders and a core-shell system. It can also be a mixture of liquid monomers and a suitable photo initiator that forms one of the above listed polymeric binder under UV irradiation after coating. Examples of suitable binder systems include the Glascol and Joncryl product supplied by BASF, the Paranol products supplied by ParaChem, the Witcobond products supplied by Baxenden Chemicals, the Texicryl products supplied by Scott-Bader and the Neo products supplied by DSM NeoResins+. Other additives of the ink formulation(s) include: solvents, surfactants, stabilizers, thickeners, waxes, opacifying agents, whitening agents such as $TiO_2$, anti-foam agents, bases, biocides, colourants, rheology modifiers, UV absorbers, anti-oxidants, HALS, wetting agents, colorants, smoke suppressants, and taggants.

It is also possible for the activatable light reactive colour change compound and the NIR absorbing agent (if present) to be applied to a substrate without the use of a coating(s). They can be directly embedded/incorporated in to the substrate, and typically added to the substrate during its manufacturing. It is also possible for one of the components to be embedded/incorporated into the substrate but the other applied via a coating.

Other Colour Change Chemistries

The coatings and substrates of the present invention can also comprise other 'non-activatable' colour change chemistries that are directly responsive to light, in particular laser light. Examples include metal oxyanions, particularly molybdates and borates, more particularly octamolybdates and metaborates with ammonium octamolybdate and sodium metaborate being the most preferred.

The coatings and substrates can also comprise charrable agents such as polysaccharides, carbohydrates, sugars and the like including: cellulose and derivatives thereof, glucose, saccharose, sucrose, maltodextrin, lactose, starch, dextrose and polydextrose and gums.

The coatings and substrates can also comprise metal salts such as base generating agents such as sodium bicarbonate and sodium carbonate.

The coatings and substrates can also comprise colour forming agents such as leuco dyes and charge transfer agents. These can used in combination with a photo or thermal acid or base generating agents. Particularly preferred photoacid generating agents include "onium types" such as sulphonium or iodonium salts. Further examples of photoacid generating agents include amine adducts of aromaticsulphonic acids such as amine adducts of dinonylnaphthalene disulphoic acid and tosylates. Other acid generating 'onium' compounds include ammonium and amine: sulphate, phosphate, hydrogen phosphate, dihydrogen phosphate and borates.

Further examples of the chemistries that can be used in combination with the present invention are taught in WO06/129086, WO07/045,912, WO02/068205, WO06/129078, WO04/043704, WO02/074548, WO07/063,339, WO6/051309 and WO09/010,393.

Substrates

The substrate can be any substrate known in the art of printing, examples include: paper, cardboard, corrugate, glass, textiles, metal, foils, wood, leather, plastic films, cellulose films, foodstuffs and pharmaceutical preparations. The substrate may be a data carrier such as a CD or a DVD. The activatable diacetylene can be applied to the substrate using an ink or surface coating formulation, or it can be embedded directly into the substrate such as paper by for example being added during the sizing stage, or extruded into a plastic film. The substrate can be laminated or remain unlaminated.

The substrate can be a melt processed plastic such as LDPE, HDPE, PP, PET and the like, that is used to make for example plastic parts such as preforms, bottles and closures, or melt-spun fibres that are used in the manufacture of for example non-woven fabrics for use in pads, nappies, feminine hygiene products and the like.

The activatable colour forming compounds can be used for bulk colouration of plastics, or for printing images, patterns, devices, machine readable codes and text directly on to the plastic part using either a laser scanning system, an array system or a lamp/mask arrangement. The activatable polyyne can be delivered to the plastic via a solid or liquid masterbatch system. Examples of suitable plastics include Acrylonitrile butadiene styrene (ABS), Acrylic (PMMA), Celluloid, Cellulose acetate, Cycloolefin Copolymer (COC), Ethylene-Vinyl Acetate (EVA), Ethylene vinyl alcohol (EVOH), Fluoroplastics (PTFE, alongside with FEP, PFA, CTFE, ECTFE, ETFE), Ionomers Kydex, a trademarked acrylic/PVC alloy, Liquid Crystal Polymer (LCP), Polyacetal (POM or Acetal), Polyacrylates (Acrylic), Polyacrylonitrile (PAN or Acrylonitrile), Polyamide (PA or Nylon), Polyamide-imide (PAI), Polyaryletherketone (PAEK or Ketone,) Polybutadiene (PBD), Polybutylene (PB), Polybutylene terephthalate (PBT), Polycaprolactone (PCL,) Polychlorotrifluoroethylene (PCTFE,) Polyethylene terephthalate (PET), Polycyclohexylene dimethylene terephthalate (PCT), Polycarbonate (PC), Polyhydroxyalkanoates (PHAs), Polyketone (PK) Polyester Polyethylene (PE) low and high density, Polyetheretherketone (PEEK), Polyetherketoneketone (PEKK), Polyetherimide (PEI), Polyethersulfone (PES), Polysulfone, Polyethylenechlorinates (PEC), Polyimide (PI), Polylactic acid (PLA), Polymethylpentene (PMP), Polyphenylene oxide (PPO), Polyphenylene sulfide (PPS), Polyphthalamide (PPA), Polypropylene (PP), Polystyrene (PS), Polysulfone (PSU), Polytrimethylene terephthalate (PTT), Polyurethane (PU), Polyvinyl acetate (PVA), Polyvinyl chloride (PVC), Polyvinylidene chloride (PVDC), Styrene-acrylonitrile (SAN) and the like. The plastic comprising the 'activatable' poly-yne compound can be used to make any plastic parts, examples includes ridged plastic packaging such as preforms, bottles and closures, or melt-spun fibres that are used in the manufacture of for example non-woven fabrics for use in pads, nappies, feminine hygiene products and the like.

The substrate comprising activatable diacetylenes of the present invention can be used in the manufacture of printed items, examples include primary and secondary packaging, newspapers, magazines, leaflets, pamphlets and books, posters, labels in combination with an adhesive backing, security documents such as banknotes, cheques, currency, tickets, passports, licenses and the like, it can be used in desktop/home printing applications, commercial wide-web printing applications, The substrate can also be any used in printed electronics applications such as a circuit board manufacture. The substrate can be used to display human readable and/or machine readable information, such as text, graphics, barcodes and the like.

Light Sources

The light source used for the initial activation is preferably one that can be used to melt the initially unreactive colour forming diacetylene. It can be in the wavelength range 200 nm to 25 microns. More preferably still it is near-infrared light in the wavelength range 700 to 2500 nm, and even more preferably still approximately corresponds with the absorbance profile of the NIR light absorbing agent used. The light can be broadband or mono-chromatic, non-coherent or laser radiation. Preferably the light is NIR laser radiation. The laser can be a pulse or continuous wave laser, a fibre laser or a diode laser, or an array of diodes. A $CO_2$ laser operating with an approximate wavelength of 10.6 microns is also preferred.

The light used into initiate the colour change reaction of the previously activated colour forming compound can be in the wavelength range 200 nm to 25 microns. More preferably it is UV light in the wavelength range 200 to 400 nm, or short wavelength visible light in the range 400 to 450 nm. The light can be broadband or mono-chromatic, non-coherent or laser radiation. The light can be non-coherent light as supplied by a lamp and is used merely to flood the whole substrate surface with light. Examples of UV light sources that can be used include germicidal lamps and mercury arc lamps. Alternatively, a UV laser or UV diode light source can be used, particularly where more precise placement of light is required. A lamp/mask arrangement can also be used. A $CO_2$ laser operating with an approximate wavelength of 10.6 microns is also preferred, particularly if chemistries responsive to $CO_2$ laser light are also present. Where a laser system is employed it can be a pulsed or continuous wave laser. The light beam can be steered using a mirror based galvanometer type system or emitted from an array of light sources.

The present invention also includes the use of photoacid generators, such as those taught in WO06/018640, to sensitise the poly-yne to light of longer wavelength than its intrinsic absorption, once it has been activated.

EXAMPLES

Ink Formulations

1. CHP ink aqueous based
   CHP (50 g) was added to Paranol T-6320 (148 g) and Dispelair CF49 (2 g). The mixture was milled for 10 minutes on a 50 ml bead mill.
2. CHP ink solvent based
   CHP (50 g) was added to a 15% solution of Elvacite 2028 in ethyl acetate (150 g). The mixture was milled for 10 minutes on a 50 ml bead mill.
3. 10,12-Docosadiyndioic acid dipropargylamide (10,12-DDA-PADA) ink aqueous based
   10,12-DDA-PADA (10 g) was added to Paranol T-6320 (188 g) and Dispelair CF49 (2 g). The mixture was milled for 10 minutes on a 50 ml bead mill.
4. 10,12-DDA-PADA ink solvent based
   10,12-DDA-PADA (10 g) was added to a 15% solution of Elvacite 2028 in ethyl acetate (190 g). The mixture was milled for 10 minutes on a 50 ml bead mill.
5. Mixed ink aqueous based
   10,12-DDA-PADA (10 g) and CHP (50 g) were added to Paranol T-6320 (138 g) and Dispelair CF49 (2 g). The mixture was milled for 10 minutes on a 50 ml bead mill.
6. Mixed ink solvent based
   10,12-DDA-PADA (10 g) and CHP (50 g) were added to a 15% solution of Elvacite 2028 in ethyl acetate (140 g). The mixture was milled for 10 minutes on a 50 ml bead mill.

Inks 7 to 12 were prepared as inks 1 to 6 but substituting CHP (50 g) for 2 g of N,N,N',N'-tetrakis(4-dibutylaminophenyl)-p-benzoquinone bis(iminium hexafluoroantimonate) Near Infrared Absorber ADS1065A purchased from ADS Inc, Canada, and increasing the amount of liquid binder to give a total ink of 200 g accordingly.

Inks 5, 6, 11 and 12 were drawn down on to white 50 micron PET film using a K2 bar.

Drawdowns were prepare with inks 1, 2, 3 and 4 using a K-2 bar as follows with CHP in one layer and 10,12-DDA-PADA in the other:
  i. Ink 1 under layer, ink 3 upper layer
  ii. Ink 1 under layer, ink 4 upper layer
  iii. Ink 3 under layer, ink 1 upper layer
  iv. Ink 4 under layer, ink 1 upper layer
  v. Ink 2 under layer, ink 3 upper layer
  vi. Ink 2 under layer, ink 4 upper layer
  vii. Ink 3 under layer, ink 2 upper layer
  viii. Ink 4 under layer, ink 2 upper layer Drawdowns were prepared with inks 7, 8, 9 and 10 using a K-2 bar as follows with CHP in one layer and 10,12-DDA-PADA in the other:
  ix. Ink 7 under layer, ink 9 upper layer
  x. Ink 7 under layer, ink 10 upper layer
  xi. Ink 9 under layer, ink 7 upper layer
  xii. Ink 10 under layer, ink 7 upper layer
  xiii. Ink 8 under layer, ink 9 upper layer
  xiv. Ink 8 under layer, ink 10 upper layer
  xv. Ink 9 under layer, ink 8 upper layer
  xvi. Ink 10 under layer, ink 8 upper layer Activating The substrates were activated using the following lasers:
1. A continuous wave fibre laser operating with a wavelength of 1070 nm and a measured power output of 18.6 W.
2. A 30 W Videojet $CO_2$ laser In each case text, graphics, logos and machine readable codes were imaged. However it this stage nothing was visible to the eye Colour Change Reactions The colour change reaction on the activated substrates was produced using UV light from the following sources:
3. A germicidal lamp, operating at 200 to 290 nm.
4. A 3 W UV laser operating at 266 nm.

It was observed that only those areas which had been pre-activated by the NIR laser or $CO_2$ laser turned blue. The unactivated areas remained colourless.

Some of the blue areas on the substrates were then re-exposed to NIR light using the 1070 nm 18.6 W fibre laser and from a heat gun. This turned the blue areas red.

Use in Combination with Ammonium Octamolybdate

An ammonium octamolybdate based ink was prepared as followed:
1. AOM (35%) was dispersed in a solution of Elvacite 2028 (15%) in ethyl acetate.

The above AOM based ink was mixed 1:1 with ink 6. prepared above and coated on to PET film.

A $CO_2$ laser was used to create black images and a NIR liaser/UV lamp used to create blue and red images.

Embedded Substrates

Paper was made comprising 10,12-docosadiyndioic acid (5%) and copper (II) hydroxyl phosphate (10%), both added at the sizing stage. The paper was found to produce blue and red images as described above.

The above combinations were also used to create a circuit board that was found to have electrical conductivity.

Example A

Reversible Activation 10,12-Pentacosadiynoic acid (via its acid chloride) was coupled on to 4,4'-diaminoazobenzene to give:

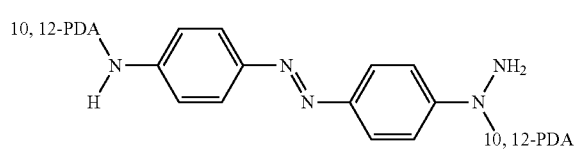

This compound was capable of switching from a relatively unreactive to a relatively reactive form on exposure to UV light.

Example B

Ring Opening Reaction

The following caprolactam diacetylene was prepared:

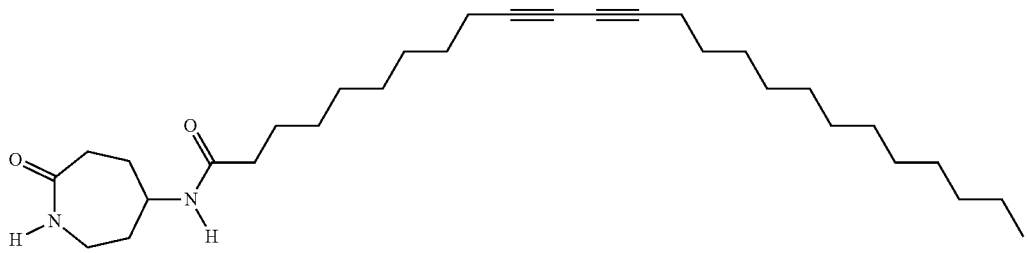 [SMILES: CCCCCCCCCCCCC#CC#CCCCCCCCCC(=O)NC1CCNC(=O)CC1]

In the ring closed form the compound was relatively unreactive, but once ring opened it was found to be relatively reactive.

Example C

Charge Generation/Removal 10,12-Docosadiyndioic glycidyldiamide was prepared by reacting 10,12-docosadiyndioic acid (via its acid chloride) with 2 moles of glycine.

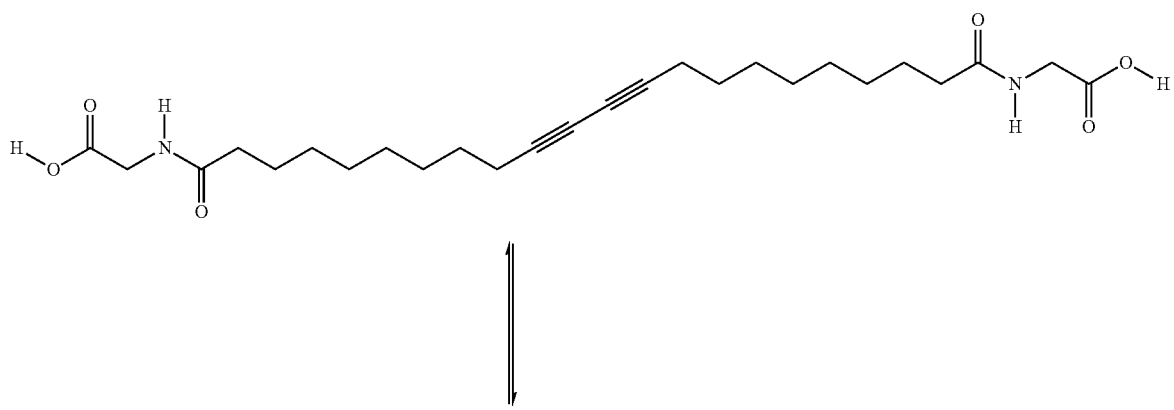

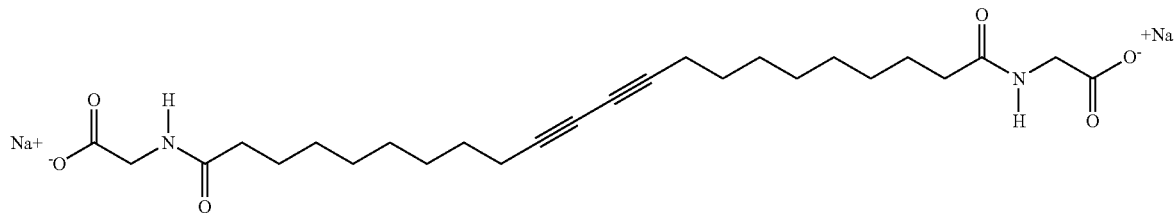

This compound was found to be a relatively reactive colour forming diacetylene in its protonated form. However, the respective anionic, sodium salt version was found to be a relatively unreactive colour forming diacetylene. The compound could be made to flip between the two forms depending upon the pH of its environment.

Example D 10,12-Docosadiyndioic aminoethylenediamide was prepared by reacting 10,12-docosadiyndioic acid (via its acid chloride) with a massive excess moles of ethylenediamine.

This compound was found to be a relatively reactive colour forming diacetylene in its unprotonated form. However, the respective cationic, protonated version was found to be a relatively unreactive colour forming diacetylene. The compound could be made to flip between the two forms depending upon the pH of its environment.

Example E

Leaving Group Cleavage

The following diacetylene ester compound was prepared. It was found that prior to hydrolysis of the ester group the compound was relatively unreactive but upon hydrolysis a relatively reactive diacetylene derivative was obtained. (i.e. 10,12-pentacosdaiynoic acid was regenerated).

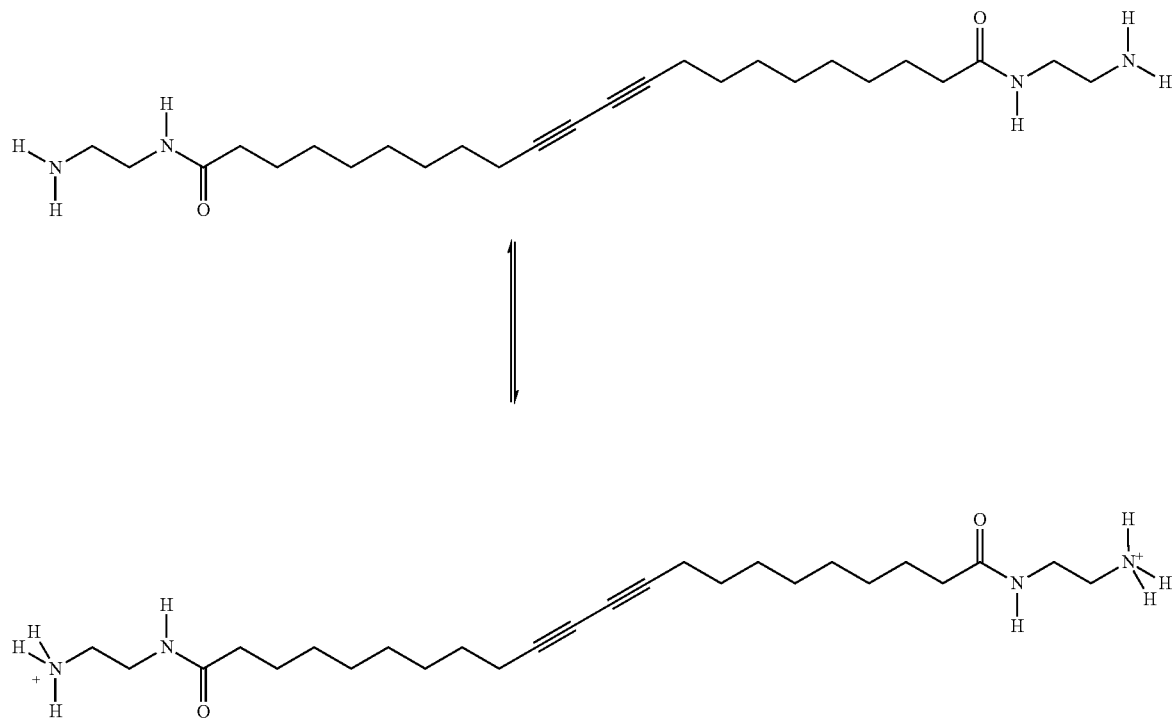

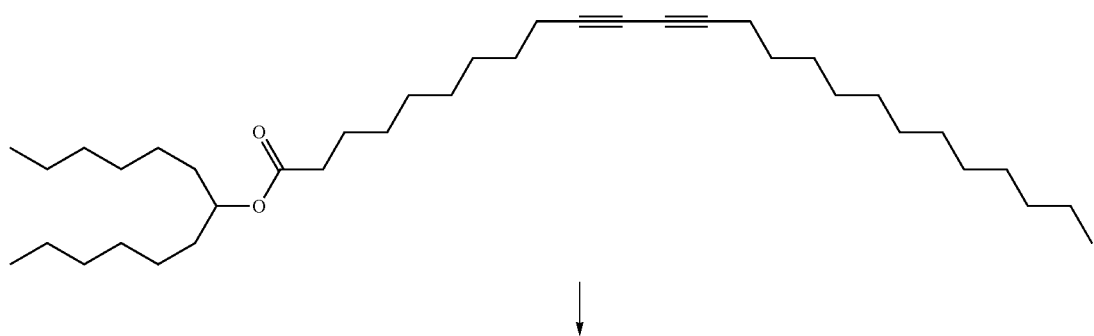
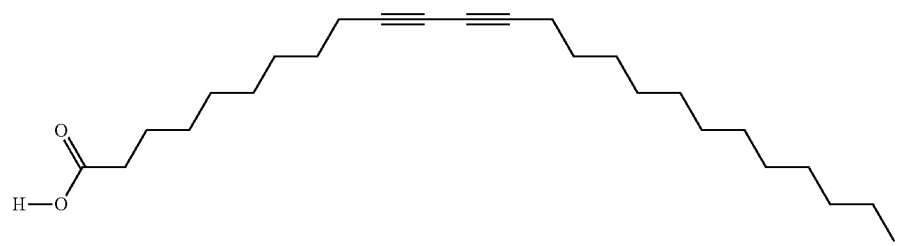
Example F
Photochromism
The following diacetylene-spirooxazine compound was made.
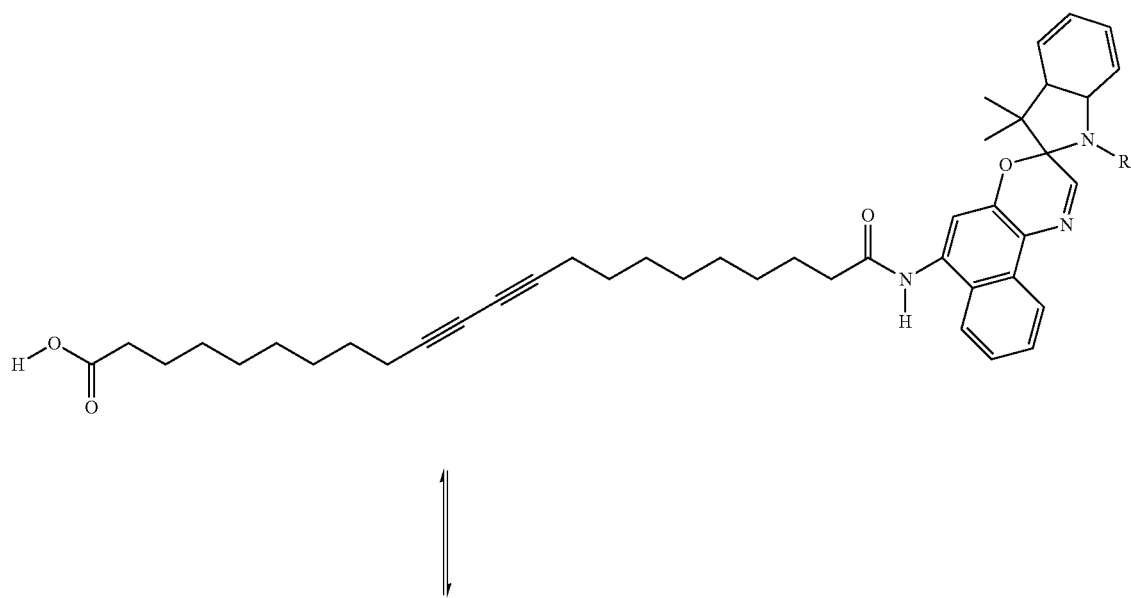

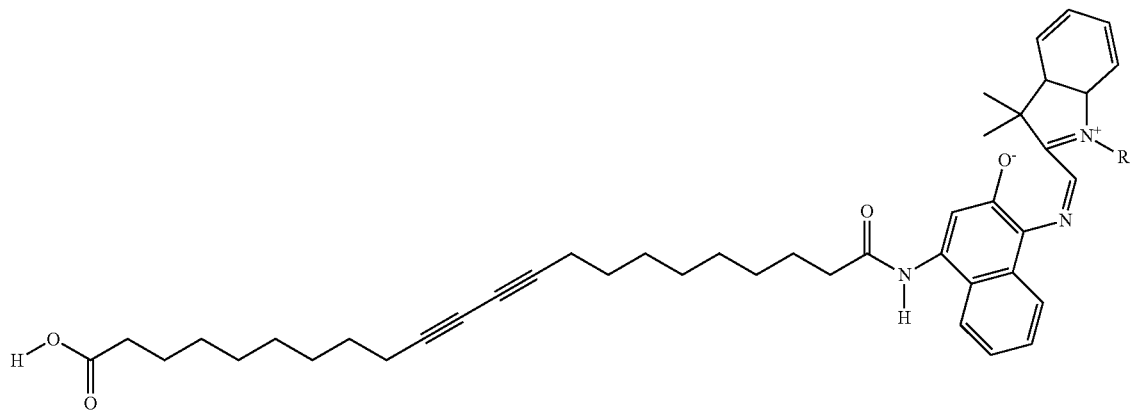

This compound was found to be relatively unreactive towards light in the "Spiro" form but was relatively reactive towards light in the "meso" form. Other examples include diacetylene-triarylmethanes, stilbenes, azastilbenes, nitrones, fulgides, spiropyrans, naphthopyrans, spiro-oxazines, quinones and diarylethenes.

Example G

Chirality

The following diacetylene compound was synthesized comprising a chiral carbon centre. It was found that one particular enantiomer was relatively unreactive but the other was relatively reactive.

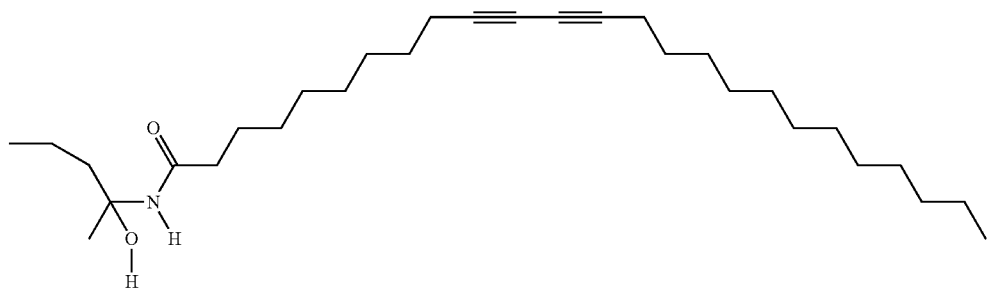 [SMILES: CCCCCCCCCCCCC#CC#CCCCCCCCCC(=O)NC(C)(O)CCC]

Example H

Fluoro Compounds

The following fluorocarbon diamide of 10,12-docosadiyn-dioic acid was synthesized.

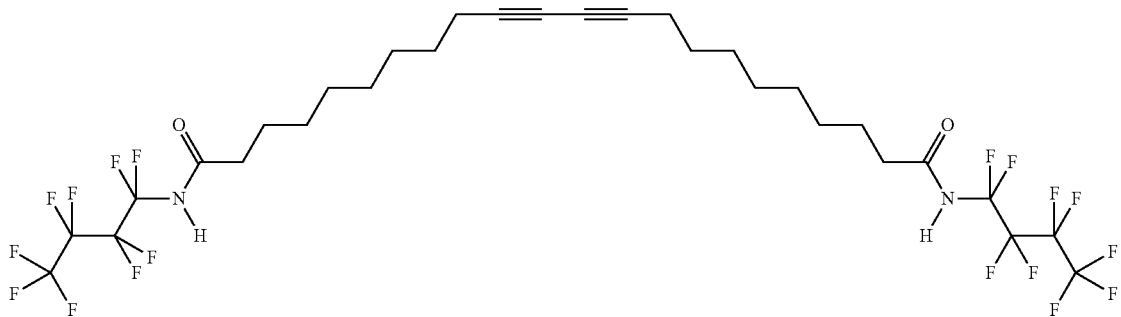 [SMILES: O=C(CCCCCCCCC#CC#CCCCCCCCCC(=O)NC(F)(F)C(F)(F)C(F)(F)C(F)(F)F)NC(F)(F)C(F)(F)C(F)(F)C(F)(F)F]

The compound was found to exist in two crystal forms, one relatively unreactive, and the other relatively reactive.

Example I

Water of Hydration

The following diacetylene was prepared comprising a group capable of functioning as a humectant and attracting water of crystallisation. In this example, a PEG chain. It was found that heating the sample to remove this associated water of crystallisation resulted in the formation of a relatively reactive form from a relatively unreactive one.

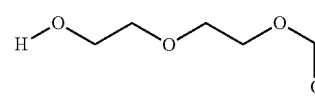

Example J

Co-Crystals 10,12-Docosadiyndioic acid was co-crystallised with the oxalamide of glycine to give the following co-crystal:

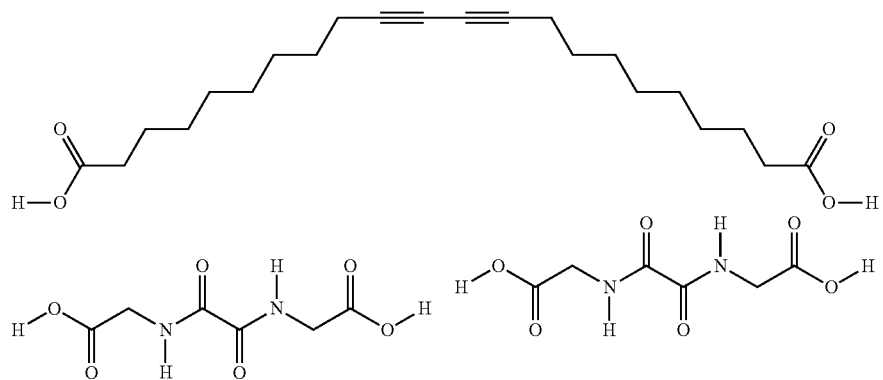

Example K

Metal Complexes 10,12-Pentacosadiyndioic acid was coordinately bonded to $Cu^{2+}$ ions via its carboxylic acid group to give the following compound:

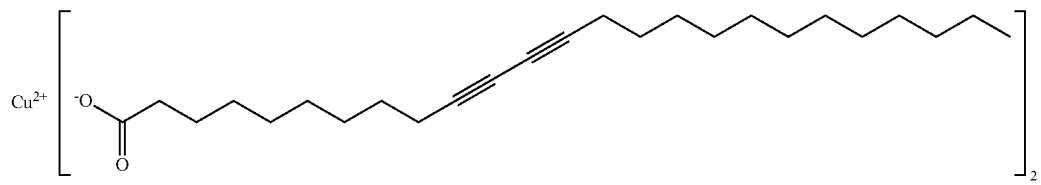

It was found that this compound was relatively unreactive compared to uncomplexed 10,12-pentacosadiynoic acid. However, relatively reactive 10,12-pentacosadiynoic acid could be liberated from the complex by heating.

Example L

Electro-Diacetylenes

This zwitterionic diacetylene will line up in an electrical field to give a form that is relatively reactive from one that was relatively unreactive.

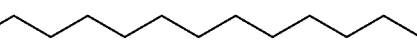

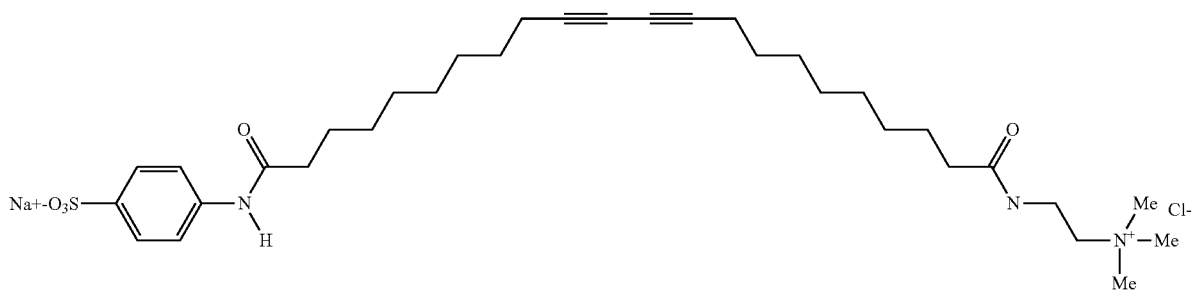

Example M

Heat Activated Single Ink Formulation

The following ink formulation was prepared:

| | |
|---|---|
| Aqueous based acrylic binders | 58 g |
| Water | 14.95 g |
| Anti-foam | 0.1 g |
| Non-ionic surfactants | 0.45 g |
| Reduced (blue) ITO | 2.5 g |
| 10,12-Docosadiyn-bis-propargylamide | 15.0 g |
| Isopropanol | 4.0 g |
| UV Absorber | 3 g |
| HALS | 2 g |

The formulation was milled using a 50 ml Eiger-Torrance bead mill until a particle size <5 microns had been achieved. The ink was then coated onto both clear and white 50 micron OPP substrate at a coat weight of 10 gsm. The ink was also coated on to white label stock paper at 10 gsm.
Activation was performed using one of the following 4 laser systems all of which were controlled by an IBM compatible pc:
 i. 1070 nm fibre laser.
 ii. 1470 nm fibre laser.
 iii. 1550 nm fibre laser.
 iv. 10.6 micron $CO_2$ laser.
The colourless to blue colour change reaction was then achieved using one of the following:
 a. Broadband UV (germicidal) lamp.
 b. 266 nm UV laser controlled by an IBM compatible pc.
Blue images were produced only in the areas initially NIR/$CO_2$ activated. The blue images turned magenta, red, orange and yellow upon irradiation with NIR or $CO_2$ radiation. A mixture of blue and yellow was used to create green colours.

Example N

Heat Activated Single Ink Formulation

The following ink formulation was prepared:

| | |
|---|---|
| Aqueous based acrylic binders | 58 g |
| Water | 14.95 g |
| Anti-foam | 0.1 g |
| Non-ionic surfactants | 0.45 g |
| Reduced (blue) ITO | 2.5 g |
| 10,12-Docosadiyn-bis-octadecylamide | 15.0 g |
| Isopropanol | 4.0 g |
| UV Absorber | 3 g |
| HALS | 2 g |

The formulation was milled using a 50 ml Eiger-Torrance bead mill until a particle size <5 microns had been achieved. The ink was then coated onto both clear and white 50 micron OPP substrate at a coat weight of 10 gsm. The ink was also coated on to white label stock paper at 10 gsm.
Activation was performed using one of the following 4 laser systems all of which were controlled by an IBM compatible pc:
 v. 1070 nm fibre laser.
 vi. 1470 nm fibre laser.
 vii. 1550 nm fibre laser.
 viii. 10.6 micron $CO_2$ laser.
The colourless to blue colour change reaction was then achieved using one of the following:
 c. Broadband UV (germicidal) lamp.
 d. 266 nm UV laser controlled by an IBM compatible pc.
Blue images were produced only in the areas initially NIR/$CO_2$ activated. The blue images turned magenta, red, orange and yellow upon irradiation with NIR or $CO_2$ radiation. A mixture of blue and yellow was used to create green colours.

Example O

Printed Electronics 1. 10,12-Docosadiyndioic-bis-propargylamide was applied to a glass slide using a spin coating technique. The film thickness was approximately 250 microns.
2. 10,12-Docosadiyndioic-bis-propargylamide and Cyracure UVI-6974 (10% weight of diacetylene) were applied to a glass slide using a spin coating technique. The film thickness was approximately 250 microns.
Activation:
a. A UVC germicidal lamp (<280 nm) was used to activate both glass slides. The diacetylene initially turned blue but was left under the lamp until it had acquired a coppery sheen.
b. A 266 nm UV laser control by an IBM compatible pc was used to create a line of polydiacetylene 1 cm wide in the middle of the coated glass slide.
Conductivity Measurements:
Conductivity was assessed by measuring the voltage and current characteristics generated by the polydiacetylene coated glass slides. For the germicidal lamp activated results were before and after activation. For the laser imaged slides results were for the polymerised 1 cm wide zone compared to the unpolymerised portions either side of it.
Results
Conductivity Results
1. Germicidal Lamp Activation
 Unpolymerised=negligible conductivity.
 Polymerised and undoped=1,000 fold increase in conductivity.

Polymerised and doped=100,000 fold increase in conductivity

2. UV Laser Activated

Unpolymerised zone=negligible conductivity

Polymerised and undoped=1,000 fold increase in conductivity.

Polymerised and doped=100,000 fold increase in conductivity

The invention claimed is:

1. A method of forming an image on a substrate, which comprises:
    applying to the substrate an activatable colour forming compound, wherein said activatable colour forming compound is initially unreactive but becomes reactive upon activation;
    activating said colour forming compound in the areas of the substrate where the image is to be formed, wherein said activation does not cause the colour forming compound to change colour; and
    reacting the activated colour forming compound into its coloured form to produce an image,
    wherein the colour forming compound is an amide derivative of a diacetylene.

2. The method according to claim 1, wherein the diacetylene is 10,12-pentacosadiynoic acid or 10,12-docosadiyndioic acid.

3. The method according to claim 2, wherein the amine-derived portion of the colour forming compound is a primary amine.

4. The method according to claim 3, wherein the primary amine is propargylamine, a carboxylic acid amine, alcohol amine or amino-PEG.

5. The method according to claim 1, wherein the diacetylene is a ring diacetylene compound.

6. The method according to claim 1, wherein activation is by exposure to a stimulus selected from one or more of heat, light, pressure and electrical discharge.

7. The method according to claim 1, wherein the compound is heat-activatable and optionally, a light absorbing agent is applied to the substrate, which is a near infrared absorbing agent that absorbs light in the wavelength range 700 to 2500 nm.

8. The method according to claim 7, wherein the near infrared absorbing agent absorbing light in the wavelength range 700 to 2500 nm is present and is: an organic dye/pigment, a conductive polymer, an inorganic copper (II) salt such as copper (II) hydroxyl phosphate, or a non-stoichiometric inorganic compound.

9. The method according to claim 7, wherein the activatable colour forming compound and light absorbing agent (if present) are applied to the substrate in one coating.

10. The method according to claim 7, wherein the activatable colour forming compound and light absorbing agent (if present) are applied to the substrate in separate coatings.

11. The method according to claim 7, wherein either the activatable colour forming compound and/or the light absorbing agent (if present) are embedded in the substrate.

12. The method according to claim 1, wherein the colour forming compound is reversibly activatable.

13. The method according to claim 1, wherein activation comprises polymorphism of the colour forming compound.

14. The method according to claim 1, wherein activation comprises a ring-opening reaction, charge generation or removal, leaving group cleavage, photochromism, conversion between optical isomers or enantiomers, conversion between crystal forms, the addition or removal of an activating or deactivating agent, the addition or removal of water of crystallisation, co-crystallisation, liquid crystal formation, metal complex formation, surface activation or the application of an electric field.

15. The method according to claim 1, wherein light is used to activate the colour forming compound which is near infrared light in the wavelength range 700 to 2500 nm, wherein the near infrared light in the wavelength range 700 to 2500 nm is supplied by a laser.

16. The method according to claim 1, wherein the activation is performed using light supplied by a $CO_2$ laser.

17. The method according to claim 1, wherein the activated substrate is subsequently exposed to light in the wavelength range 200 to 450 nm, which causes the activated parts of the substrate to undergo a colour change reaction to form an image.

18. The method according to claim 1, where the coating or substrate further comprises a direct light responsive colour change material, which is a metal oxyanion compound, a charrable agent, a leuco dye or a charge transfer agent.

19. The method according to claim 18, where the metal oxyanion compound is ammonium octamolybdate or sodium metaborate.

20. The method according to claim 18, wherein the charrable agent is a polysaccharide, carbohydrate, or sugar.

21. The method according to claim 20, wherein the charrable agent is used in combination with a metal salt, or an ammonium salt.

22. The method according to claim 1, wherein the imaged substrate is capable of conducting electricity.

23. The method according to claim 1, wherein the substrate is paper, a plastic film, a plastic part, a textile, glass, metal, foil, a foodstuff or a pharmaceutical preparation.

24. A substrate imaged using the method according to claim 1.

25. A method for displaying human and/or machine readable information wherein said method comprises displaying the information on the substrate according to claim 24.

* * * * *